United States Patent
Roy

(10) Patent No.: US 11,581,345 B2
(45) Date of Patent: Feb. 14, 2023

(54) IMAGE SENSOR COMPRISING, A PIXEL EQUIPPED WITH A MOS CAPACITIVE ELEMENT, AND CORRESPONDING CONTROL METHOD

(71) Applicant: STMicroelectronics (Crolles 2) SAS, Crolles (FR)

(72) Inventor: Francois Roy, Seyssin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 127 days.

(21) Appl. No.: 17/122,314

(22) Filed: Dec. 15, 2020

(65) Prior Publication Data

US 2021/0193710 A1  Jun. 24, 2021

(30) Foreign Application Priority Data

Dec. 18, 2019  (FR) ...................................... 1914701

(51) Int. Cl.
*H04N 5/3745* (2011.01)
*H01L 27/146* (2006.01)

(52) U.S. Cl.
CPC .... *H01L 27/14609* (2013.01); *H01L 27/1463* (2013.01); *H01L 27/14643* (2013.01); *H04N 5/37452* (2013.01)

(58) Field of Classification Search
None
See application file for complete search history.

(56) References Cited

U.S. PATENT DOCUMENTS

2009/0201395 A1* 8/2009 Manabe .............. H01L 27/1463
  257/E31.119
2010/0213352 A1* 8/2010 Veeder ..................... G01J 1/46
  250/214 C (Continued)

FOREIGN PATENT DOCUMENTS

FR  2930676 A1  10/2009
FR  2963163 A1  1/2012

OTHER PUBLICATIONS

Author: Uehara et al. Title: "A high-sensitive digital photosensor using MOS interface-trap charge pumping" Date: Dec. 25, 2004 Publisher: IEICE Electronics Express, vol. 1 (Year: 2004).*

(Continued)

*Primary Examiner* — Twyler L Haskins
*Assistant Examiner* — Wesley J Chiu
(74) *Attorney, Agent, or Firm* — Crowe & Dunlevy

(57) ABSTRACT

An image sensor includes a pixel with a photosensitive region accommodated within a semiconductor substrate and a MOS capacitive element with a conducting electrode electrically isolated by a dielectric layer. The dielectric layer forms an interface with both the photosensitive region and the semiconductor substrate, the interface of the dielectric layer including charge traps. A control circuit biases the electrode of the MOS capacitive element with a charge pumping signal designed to generate an alternation of successive inversion regimes and accumulation regimes in the photosensitive region. The charge pumping signal produces recombinations of photogenerated charges in the charge traps of the interface of the dielectric layer and the generation of a substrate current to empty recombined photogenerated charges.

26 Claims, 7 Drawing Sheets

(56) References Cited

U.S. PATENT DOCUMENTS

2014/0246568 A1* 9/2014 Wan .................. H01L 27/14612
                                                        438/66
2017/0146657 A1* 5/2017 Xu ........................ G01S 17/894
2017/0194372 A1* 7/2017 Ha ...................... H01L 27/1463
2017/0214878 A1* 7/2017 Van Der Tempel ..........................
                                                        H04N 5/3559
2019/0280024 A1* 9/2019 Roy .................. H01L 27/14603
2020/0212088 A1* 7/2020 Kwag ............... H01L 27/14603

OTHER PUBLICATIONS

INPI Search Report and Written Opinion for FR Appl. No. 1914701 dated Jun. 23, 2020 (11 pages).

* cited by examiner

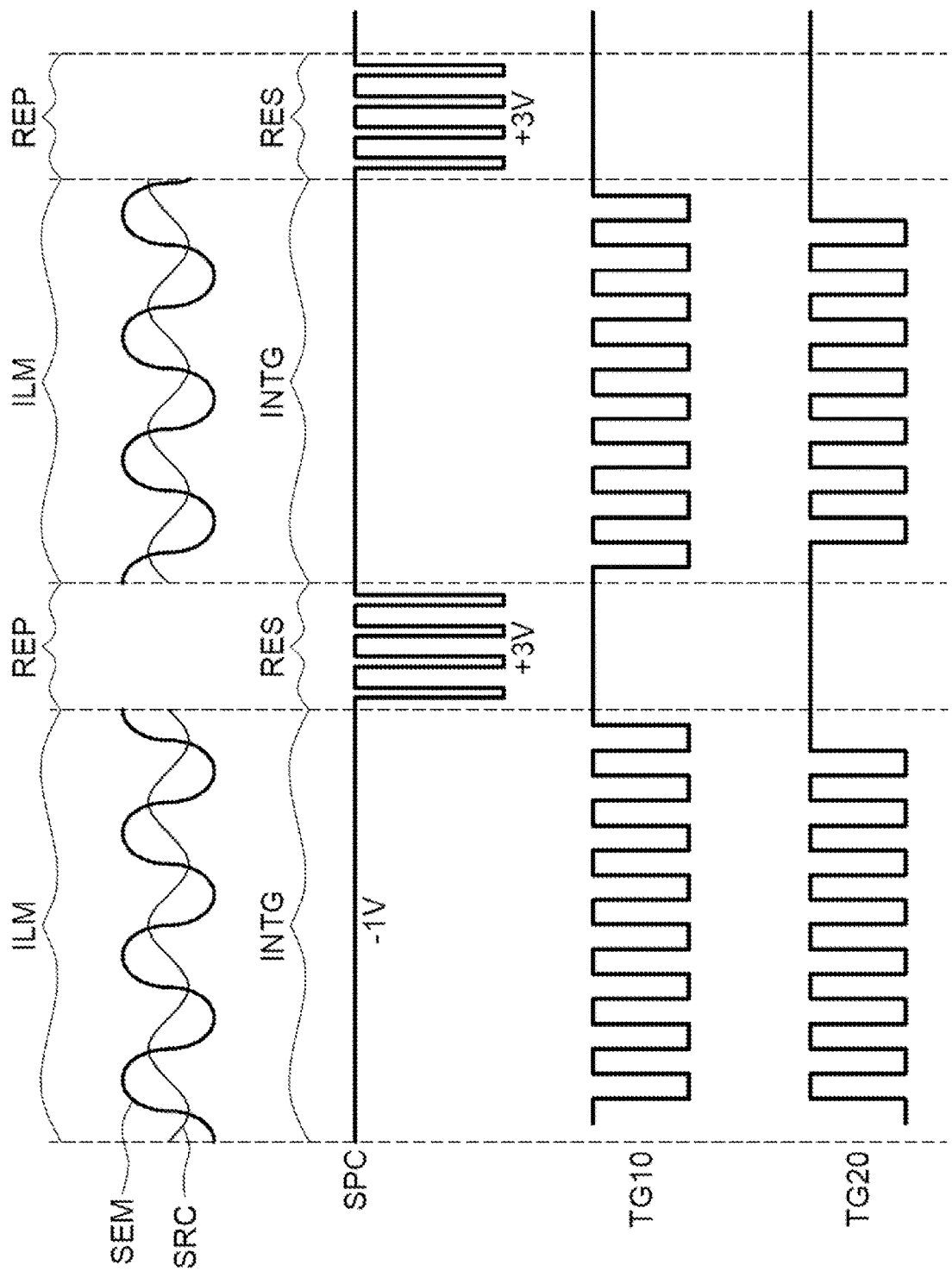

IMAGE SENSOR COMPRISING, A PIXEL EQUIPPED WITH A MOS CAPACITIVE ELEMENT, AND CORRESPONDING CONTROL METHOD

PRIORITY CLAIM

This application claims the priority benefit of French Application for Patent No. 1914701, filed on Dec. 18, 2019, the content of which is hereby incorporated by reference in its entirety to the maximum extent allowable by law.

TECHNICAL FIELD

Various embodiments and their implementation relate to image sensors and, in particular, to image sensors comprising a device for resetting the charge of the photosensitive areas of the pixels.

BACKGROUND

Image sensors typically comprise pixels comprising photodiodes and a read circuit. In the sensors of the global shutter type, an integration phase, in other words a phase for exposure of the photodiodes to light, is carried out simultaneously for all the pixels. Each pixel typically comprises a memory location, and the charges photogenerated by all the photodiodes are transferred to the respective memory locations. A read of the image is then carried out sequentially in each memory location without, however, introducing a time shift in the integration.

This type of image sensor typically comprises a device for resetting each pixel, allowing the charges photogenerated outside of an integration phase to be emptied, conventionally by means of an additional transistor that is switched into its conducting state for the reset. The charges of the photodiode are thus typically evacuated via the conduction terminals of the additional transistor, for example, towards a high-voltage reference terminal, typically a metal track contacting the drain of the transistor.

This type of additional transistor also conventionally allows an effect of light overloading of the pixel, due to a saturation of charges photogenerated during the integration, to be limited. The light overload effect (usually referred to as 'blooming') corresponds to a surplus of charges when the photodiode is at saturation, which can spontaneously empty itself for example into the memory location of the pixel or into a neighboring pixel. The additional transistor is accordingly switched into its conducting state in order to evacuate said charge surplus towards the high-voltage reference terminal.

However, the space used by the additional transistor, notably the conduction regions of this transistor and the contacts on the conduction regions, are detrimental to the density of pixels and to the performance characteristics of the pixels, such as the sensitivity and the saturation charge.

There is accordingly a need in the art to provide solutions reducing the size of the pixels, for resetting the photodiodes and for reducing or even eliminating the blooming effect.

SUMMARY

According to one aspect, an image sensor is provided comprising at least one pixel comprising a photosensitive region accommodated within a semiconductor substrate, and a capacitive element of the metal-oxide-semiconductor "MOS" type comprising a conducting electrode electrically isolated by a dielectric layer having an interface with the photosensitive region and with the semiconductor substrate, the interface of the dielectric layer comprising charge traps, the image sensor comprising a control circuit configured for biasing the electrode of the MOS capacitive element with a charge pumping signal designed to generate an alternation of successive inversion regimes and accumulation regimes in the photosensitive region, in such a manner as to produce recombinations of photogenerated charges in the charge traps of the interface of the dielectric layer.

The recombinations of the trapped charges allow the photosensitive region of the diode to be emptied of the photogenerated charges, for example prior to an integration phase or in the case of saturation.

Thus, only one MOS capacitive element biased on one electrode is used for resetting the charges of the photodiode and compensating the blooming. This means that, with respect to the conventional pixels equipped with an additional transistor comprising conduction regions, able to be specifically doped, and having terminals for contact with a potential, the MOS capacitive element comprising a conducting electrode electrically isolated by a dielectric layer, is simpler, smaller, and allows the size of the pixels to be reduced.

According to one embodiment, the control circuit is configured for generating the charge pumping signal comprising square voltage pulses.

With a square pulse signal, the rise and fall times of the pulses are very short and the switching between the inversion and accumulation regimes is very fast, for example faster than a spontaneous relaxation time of a charge of a trap, and this improves the efficiency of the recombinations of the trapped charges.

According to one embodiment, the control circuit is configured for generating the charge pumping signal designed to generate recombinations of the photogenerated charges with opposite charges and trappings of the photogenerated charges, in the charge traps at the interface, during the successive inversion regimes; and for generating recombinations of the photogenerated trapped charges with opposite charges and trappings of opposite charges, in the charge traps at the interface, during the successive accumulation regimes.

This configuration of charge pumping mechanism (in other words the mechanism of successive recombinations) at the dielectric interface produces a substrate current, and this substrate current may, for example, be used to evacuate all the photogenerated charges, or to maintain a saturation charge, in the photosensitive region.

According to one embodiment, the capacitive element exhibits a capacitive deep trench isolation structure having said conducting electrode extending vertically into the substrate, and having said dielectric layer surrounding the conducting electrode on the sides and the bottom of the capacitive deep trench isolation structure.

On the one hand, the capacitive deep trench isolation structures are well controlled and generally included in the fabrication processes, and do not introduce any step dedicated to the formation of the MOS capacitive element. On the other hand, the interface between the dielectric and the photosensitive region extends vertically in depth and is consequently optimized in terms of surface area with respect to the photosensitive region.

Furthermore, the capacitive deep trench isolation structures are very effective devices for electrically isolating the photosensitive regions of the neighboring pixels.

Thus, the capacitive deep trench isolation structure of the MOS capacitive element may advantageously be configured for isolating the photosensitive regions of neighboring pixels from one another.

This furthermore allows one MOS capacitive element to be shared for at least two pixels.

According to an alternative embodiment, the photosensitive region of the pixel is configured for receiving a light signal incident on a back face of the semiconductor substrate, and the MOS capacitive element has a planar structure having said conducting electrode extending over said dielectric layer, the dielectric layer lying horizontally on a front face of the substrate opposite to the back face.

Indeed, in the case of pixels configured for receiving an illumination via the back face of the substrate, a MOS planar capacitive element offers a good efficiency and a relatively small size.

According to one embodiment, the control circuit is further configured for timing a shuttering cycle of said at least one pixel, comprising a reset phase immediately followed by an integration phase for a photogeneration of charges within the photosensitive region, the control circuit being configured for generating the charge pumping signal designed to reset the charge of the photosensitive region of the pixel by recombination of the photogenerated charges contained in the photosensitive region, during the reset phase.

In other words, the charge pumping mechanism may be designed, according to this embodiment, to empty the unwanted charges photogenerated in the photosensitive regions, in other words, for example, charges which are not generated during an integration phase.

Such a shuttering cycle comprising such a reset phase may advantageously be applied in an imaging device or in a device for measuring distance by time of flight, for example such as defined hereinafter.

According to one embodiment, the control circuit is further configured for timing a shuttering cycle of said at least one pixel comprising an integration phase for a photogeneration of charges in the photosensitive region, the control circuit being configured for generating the charge pumping signal designed to keep the charge of the photosensitive region of the pixel lower than a saturation threshold, by recombination of the charges photogenerated in saturation, during the integration phase.

In other words, the charge pumping mechanism may also be adapted, according to this embodiment, as an anti-blooming mechanism, so as not to exceed a saturating quantity of photogenerated charges in the photosensitive regions.

Such an anti-blooming mechanism is advantageously applicable in an imaging device, for example such as defined hereinafter.

A device is also provided for measuring distance by time of flight, comprising an image sensor such as defined hereinbefore and a light source capable of emitting a light signal, the image sensor and the light source being designed to collaborate in order to measure a distance by time of flight of the light signal during said integration phase and for providing an idle time for the light source during the reset phase.

An imaging device is also provided comprising an image sensor such as defined hereinbefore, the image sensor comprising a plurality of said pixels and being adapted to a global shutter mode of operation comprising a simultaneous exposure of all the pixels, and a sequential read of the pixels in order to reproduce an image of a light signal incident on said pixels.

According to another aspect, a method is provided for controlling an image sensor comprising at least one pixel comprising a photosensitive region accommodated within a semiconductor substrate, and a capacitive element of the metal-oxide-semiconductor "MOS" type comprising an electrically conducting electrode isolated by a dielectric layer having an interface with the photosensitive region and with the semiconductor substrate, the interface of the dielectric layer comprising charge traps, the method comprising a biasing of the electrode of the MOS capacitive element with a charge pumping signal generating an alternation of successive inversion regimes and accumulation regimes in the photosensitive region, in such a manner as to produce recombinations of photogenerated charges in the charge traps of the interface of the dielectric layer.

According to one embodiment, the charge pumping signal comprises square voltage pulses.

According to one embodiment, the charge pumping signal is designed to generate recombination of the photogenerated charges with opposite charges and trappings of the photogenerated charges, in the charge traps at the interface, during the successive inversion regimes; and for generating recombinations of the photogenerated trapped charges with opposite charges and trappings of opposite charges, in the charge traps at the interface, during the successive accumulation regimes.

According to one embodiment, in which a shuttering cycle of said at least one pixel is provided comprising a reset phase immediately followed by an integration phase comprising a photogeneration of charges by the photosensitive region of the pixel, the charge pumping signal is designed to reset the charge of the photosensitive region of the pixel by recombination of the photogenerated charges contained in the photosensitive region, during the reset phase.

According to one embodiment, in which a shuttering cycle of said at least one pixel comprising an integration phase comprising a photogeneration of charges by the photosensitive region of the pixel, the charge pumping signal is designed to keep the charge of the photosensitive region of the pixel lower than a saturation threshold, by recombination of the charges photogenerated in saturation, during the integration phase.

BRIEF DESCRIPTION OF THE DRAWINGS

Other advantages and features of the invention will become apparent upon examining the detailed description of non-limiting embodiments and their implementation and from the appended drawings in which:

FIG. 7 illustrates signals generated by a control circuit for measuring a distance by time of flight.

DETAILED DESCRIPTION

Figure 1A:
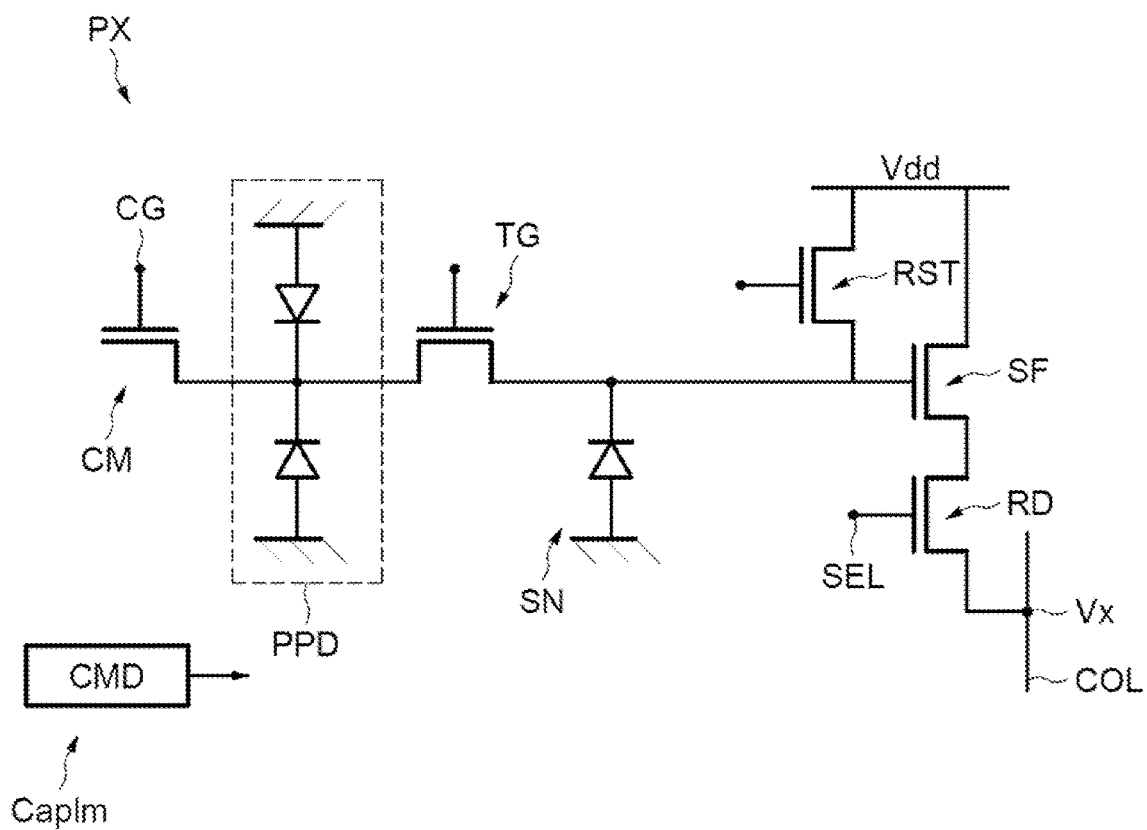
FIGS. 1A and 1B illustrate examples of a pixel of an image sensor.
Figure 1B:
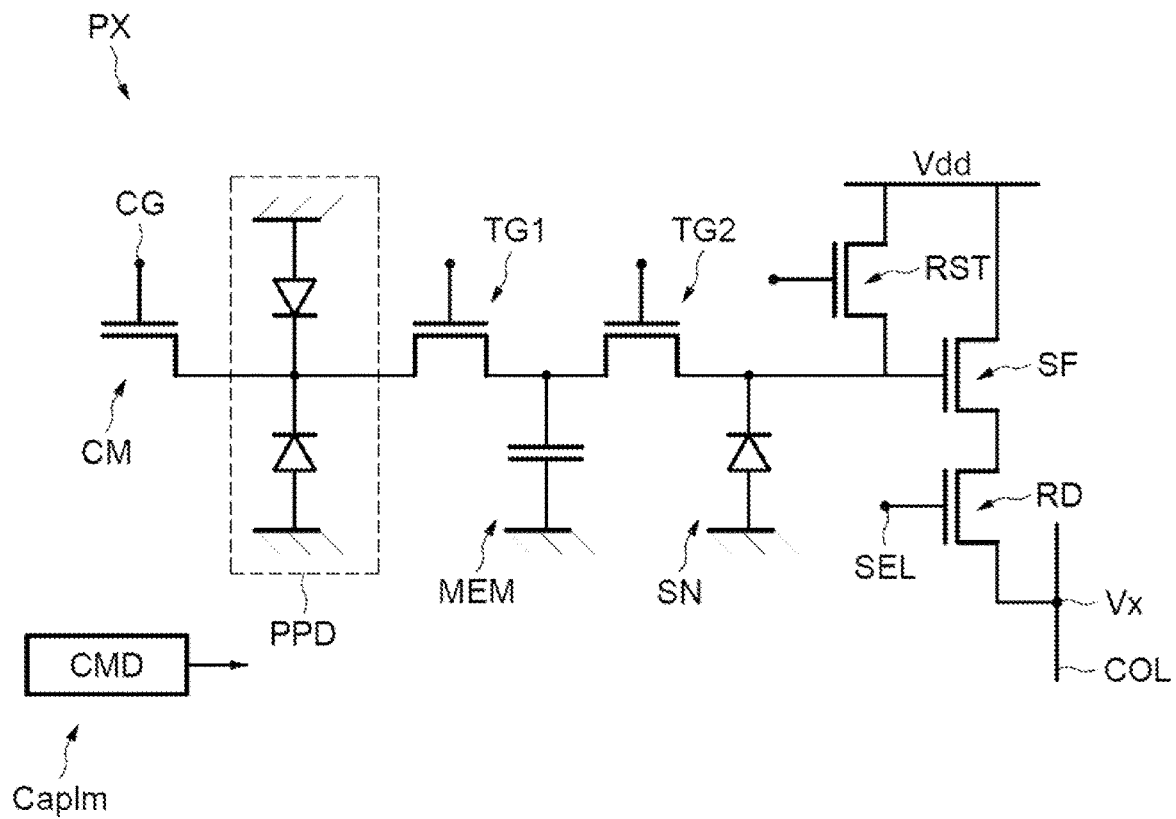

FIGS. 1A and 1B illustrate examples of a pixel PX of an image sensor CapIm. The image sensor CapIm typically comprises a plurality of such pixels PX organized in rows and in columns of a matrix.

The pixel PX comprises a photosensitive region, for example of the pinned diode PPD type, or depleted diode, formed by two p-n junctions in a semiconductor substrate arranged so that the two respective space-charge regions meet and form a fully-depleted cathode region common to the two junctions.

According to one alternative (not shown), the photosensitive region may be of the MOS pinned photo-gate (PPG) type, formed by two gate structures arranged in a semiconductor substrate in order to create two respective space-charge regions. The gate regions are configured so that the two space-charge regions meet and form a fully-depleted cathode region common to the two structures.

Such PPD and PPG photosensitive regions are capable of accumulating charges in the cathode region, generated when the cathode region is exposed to light, in a conventional manner known per se.

In this example, the pixel PX is shown in the example of a pixel using "4T" technology, in other words a pixel comprising a read circuit with four transistors comprising a transfer device TG, a read reset transistor RST, a source follower transistor SF, and a selection transistor RD.

In the example in FIG. 1A, the transfer device TG is illustrated in the form of a single transistor TG, denoted transfer transistor TG.

The transfer transistor TG is configured for transferring the charges from the photosensitive region PPD to a read region SN. The read region SN comprises a contact on a highly-doped region, for example of the N type, and is represented in FIGS. 1A and 1B as a diode circuit diagram.

In the example in FIG. 1B, the transfer device comprises a first transfer transistor TG1, configured for transferring the charge from the photosensitive region PPD to a memory location MEM equipped with a fully-depleted MOS (metal-oxide-semiconductor) capacitive element, and a second transfer transistor TG2 configured for transferring the charge of the fully-depleted MOS capacitive element of the memory location MEM to the read region SN. Similarly, the read region SN comprises a contact on a doped region, for example of the N type.

This type of transfer device TG1, MEM, TG2 is advantageous as regards the performance characteristics notably on the thermal noise "KTC", and without introducing any row-to-row shift in the integration sequence of the optical signal.

This type of pixel PX is advantageously incorporated into an image sensor CapIm adapted to a global shutter mode of operation.

In the two examples in FIGS. 1A and 1B, the read region SN is coupled to a conduction terminal of the reset transistor RST, in order to empty the read region SN of unwanted charges to a high-voltage reference terminal Vdd prior to a transfer by the transfer transistor TG (FIG. 1A), TG2 (FIG. 1B). The gate of the source follower transistor SF is coupled to the read region SN so as to convert the charge of the read region SN into a read signal Vx. The selection transistor RD is controlled by a row selection signal SEL for transmitting the read signal Vx to a read column COL.

A control circuit CMD is provided for generating control signals controlling the various transistors of each pixel PX, such as notably the control of the transfer of charge on the gate of the transfer transistor TG, or the control of the reset on the gate of the reset transistor RST.

A measurement of the difference between the read signal Vx coming from the read region SN reset (RST) before transfer and the read signal Vx after transfer (TG) forms a correlated double sampling on the read signal Vx.

Furthermore, the pixel PX comprises a reset device CM, designed to reset the charge of the photosensitive region PPD, typically for evacuating unwanted photogenerated charges before the start of an integration phase of the light signal.

In parallel, the reset device CM is designed to produce an anti-blooming effect, in other words to hold the charge of the photosensitive region PPD below a saturation threshold, during the integration phase of the light signal.

The reset device CM actually only comprises one capacitive element of the metal-oxide-semiconductor "MOS" type.

The MOS capacitive element CM thus comprises a conducting electrode CG, for example made of metal or of polycrystalline silicon, and a semiconductor electrode, electrically isolated from one another by a dielectric layer such as a silicon dioxide layer. The dielectric layer comprises charge traps at the interface between the dielectric layer and the photosensitive region PPD.

The semiconductor electrode of the MOS capacitive element CM comprises the fully-depleted cathode of the photosensitive region PPD.

The conducting electrode CG of the MOS capacitive element CM is designed to receive a control signal generated by the control circuit CMD.

As will be apparent hereinafter, notably in relation with FIGS. 4 and 5, the control circuit CMD is configured for generating a charge pumping signal biasing the conducting electrode CG of the MOS capacitive element CM in such a manner as to generate an alternation of successive inversion regimes and accumulation regimes in the photosensitive region PPD. The alternation of inversion and accumulation regimes enables recombinations of photogenerated charges to be produced and the photogenerated charges to be emptied in the form of a substrate current.

Thus, the functions for resetting the photosensitive region and for anti-blooming may be obtained by the MOS capacitive element CM alone, without using a terminal coupled to a reference voltage evacuating the charges, and this allows the pixel PX to be made with a size smaller than the way conventional pixels are made comprising a conduction terminal dedicated to evacuating the charges during resetting and anti-blooming phases.

Figure 2:
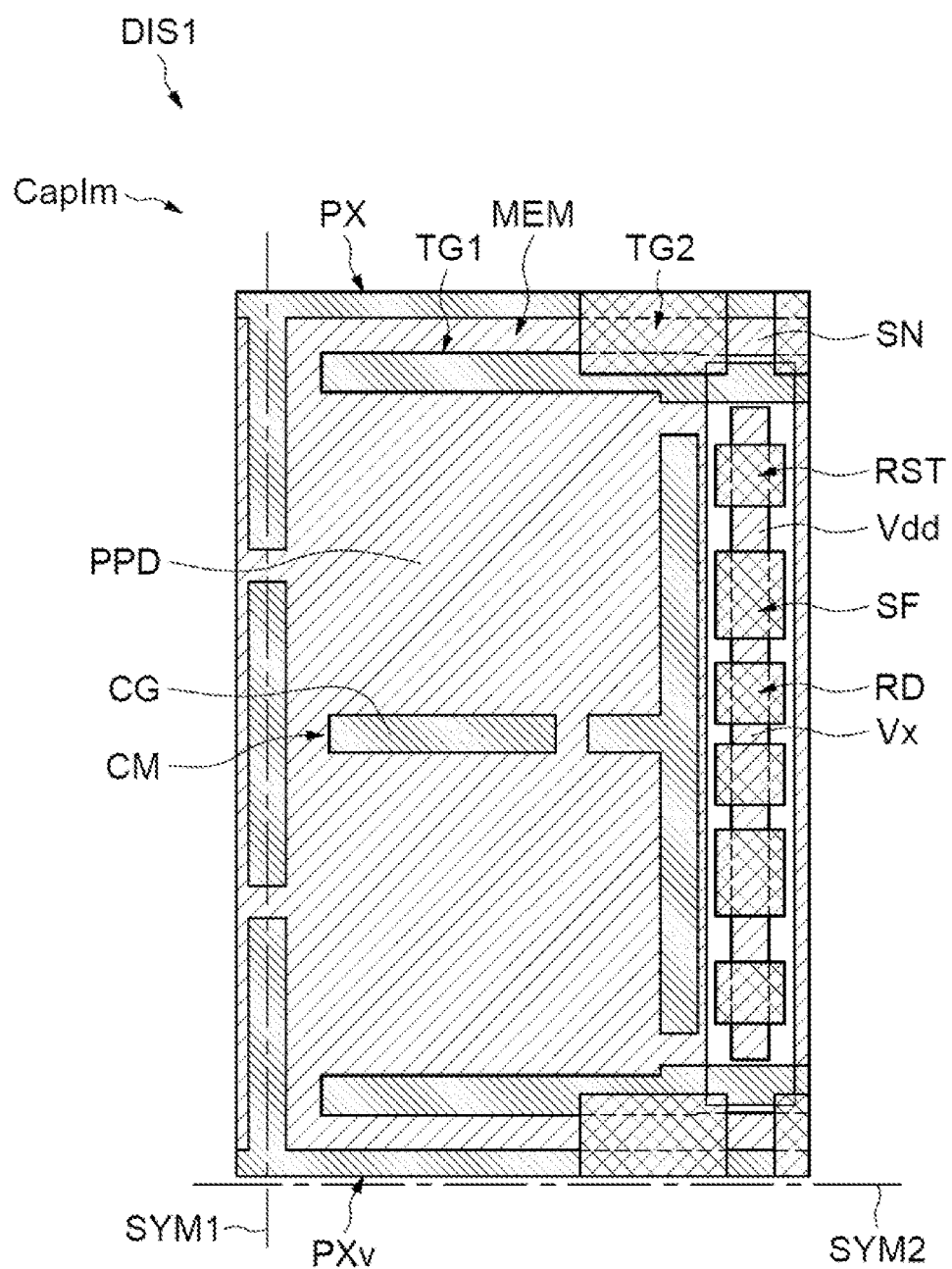
FIG. 2 shows a top view of an embodiment of the pixel described hereinabove in relation with FIG. 1B.

FIG. 2 shows a view from above of an embodiment of the pixel PX described hereinabove in relation with FIG. 1B, in which the same elements use the same references and are not all detailed again in the following part.

The MOS capacitive element CM is thus disposed between two neighboring pixels PX, PXv, in the form of a conducting electrode CG, extending vertically (perpendicularly to the plane in FIG. 2), for example according to a capacitive deep trench isolation structure CDTI, such as detailed hereinafter in relation with FIG. 3.

Furthermore, each pixel comprises a respective read circuit, which may nevertheless be common to two pixels, having the read region SN and the source follower configuration of the transistors RST and SF on the read region SN, and the selection transistor RD distributing the read signal Vx.

The first transfer transistor comprises a vertical transfer gate TG1 whose bias controls a potential barrier situated between the photosensitive region PDD and the memory location MEM, for example at one longitudinal end of the transfer gate TG1 (horizontally on the left in FIG. 2).

The memory location MEM comprises a fully-depleted MOS capacitive element formed by the transfer gate TG1 and a semiconductor region longitudinally parallel to the transfer gate TG1 (horizontal area above TG1 in FIG. 2).

The second transfer transistor TG2 comprises a planar gate between the memory location MEM and the read region SN.

This type of pixel PX is advantageously incorporated into an image sensor CapIm equipping an imaging device DIS1, such as a camera, and adapted to a global shutter mode of operation.

The image sensor CapIm naturally comprises a plurality of said pixels PX, PXv arranged, for example, by symmetry according to lateral axes SYM1 and SYM2 such as shown in FIG. 2 (orthogonal directions belonging to the plane in FIG. 2). The global shutter mode of operation comprises a simultaneous exposure of all the pixels PX, and a sequential read of the pixels via the memory location and the read region SN, so as to reproduce the image of a light signal incident on said pixels PX.

Figure 3:
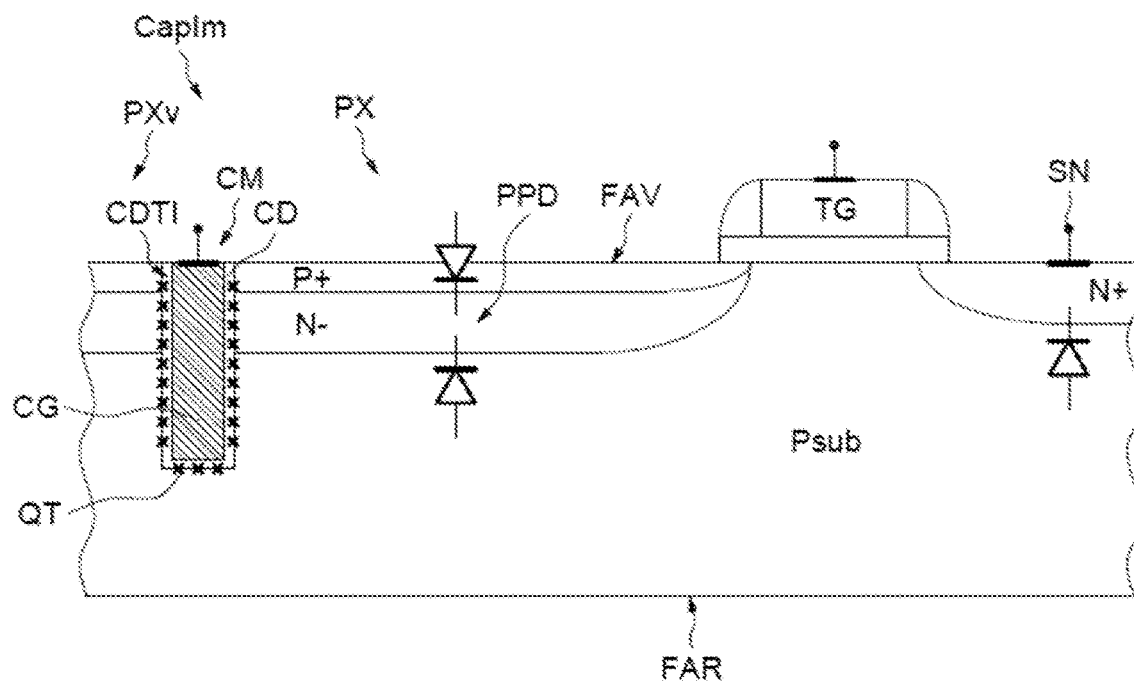
FIG. 3 is a cross-sectional view in the semiconductor substrate of an image sensor such as described in relation with FIG. 1A.

FIG. 3 shows a cross-sectional view in the semiconductor substrate Psub of an image sensor CapIm, for example such as described in relation with FIG. 1A. The common elements use the same references and will not all be detailed again in the following part. The MOS capacitive element CM of the image sensor CapIm described hereinbefore in relation with FIGS. 1B and 2 is advantageously identical to the MOS capacitive element CM described hereinbelow.

The semiconductor substrate Psub is lightly doped of the P type, and the pinned diode of the photosensitive region PPD comprises a N− cathode region lightly doped of the N type, together with a P+ pinned region doped of the P type.

The N− cathode region and the P+ pinned region are configured so that the two respective space-charge regions meet in order for the N− cathode region to be fully depleted.

In this example, the transfer device is equipped with a single transistor TG, such as described in relation with FIG. 1A. A conduction terminal of the transfer transistor TG is formed by the N− cathode region and the other conduction terminal by the read region SN, highly doped of the N type, N+; a planar gate region TG of conventional structure allows the transfer from the photosensitive region PPD to the read region SN to be controlled.

The MOS capacitive element CM has a capacitive deep trench isolation structure CDTI with said conducting electrode CG extending vertically into the substrate Psub, through the N− cathode and P+ pinned regions. The dielectric layer CD of the MOS capacitive element CM surrounds the conducting electrode CG on the sides and the bottom of the capacitive deep trench isolation structure CDTI.

Thus, on the one hand, the capacitive deep trench isolation structure CDTI of the MOS capacitive element CM allows the photosensitive regions PPD of the two neighboring pixels PX, PXv on either side of the capacitive deep trench isolation CDTI to be isolated from one another. This can also be seen in FIG. 2, knowing that the "passages" between the photosensitive regions of the neighboring pixels PX, PXv, situated at the longitudinal ends of the MOS capacitive element CM, are obstructed by potential barriers, notably during the integration phase.

On the other hand, the dielectric layer CD, for example of silicon dioxide, comprises charge traps QT, represented by crosses "x", at an interface between the dielectric layer CD and the photosensitive region PPD.

The charge traps QT at the interface may also be referred to as "interface state", and result from the crystal lattice discontinuity at the silicon dioxide—silicon interface between the dielectric layer CD and, notably, the N− cathode region of the photosensitive region PPD, made of crystalline silicon. Of course, charge traps also exist at the interface with the substrate Psub and the P+ pinned region, also made of crystalline silicon.

Si—Si or Si—O bonds, weak or distorted by the connection of the two materials, introduce, locally at the interface, energy levels that may be occupied by charges on the silicon side. These energy levels are the interface states QT, in other words the charge traps at the interface QT. A charge is trapped when it occupies an interface state QT and remains localized in the trap at the interface QT for a period defined by a time constant $\tau_R$ representative of the spontaneous relaxation time of a trapped charge.

The sign of the charges that can be trapped in the interface states QT depends on the conditions of bias applied to the device, in other words the bias applied to the conducting electrode CG of the MOS capacitive element CM.

This charge trapping mechanism in interface states QT will allow for the recombinations of the photogenerated charges, trapped in the interface states, to be produced, as described hereinafter in relation with FIGS. 4 and 5.

As an alternative to the capacitive deep trench isolation structure CDTI, the MOS capacitive element may have a planar structure (not shown) comprising a conducting electrode sitting on the dielectric layer, itself lying horizontally on a front face FAV of the substrate Psub.

Such a planar dielectric layer also introduces interface states capable of trapping a charge.

The surface on which such a planar capacitive element rests is a part of the front face FAV of the substrate Psub and the photogenerated charges in the N− fully-depleted cathode region are channeled towards the interface by the formation of a channel in the inversion regime.

This alternative may be advantageous in the framework of an image sensor in which the photosensitive region PPD of the pixel is configured for receiving a light signal incident on a back face FAR of the semiconductor substrate Psub, opposite to the front face FAV. This is because, in the framework of a device using illumination via the back face FAR, the surface of the front face of the substrate may be covered by components without hindering the access of the light. This may be advantageous notably as regards the flexibility of the architecture of the components.

Figure 4:
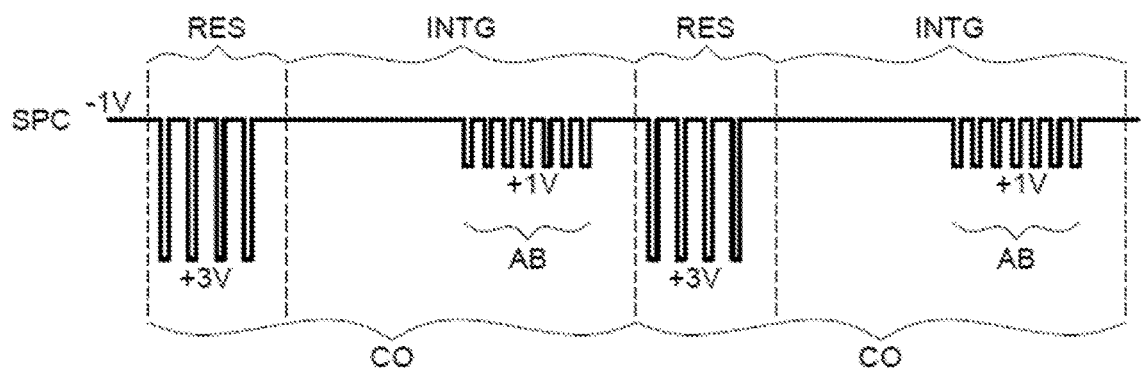
FIG. 4 illustrates one example of a charge pumping signal.
Figure 5:
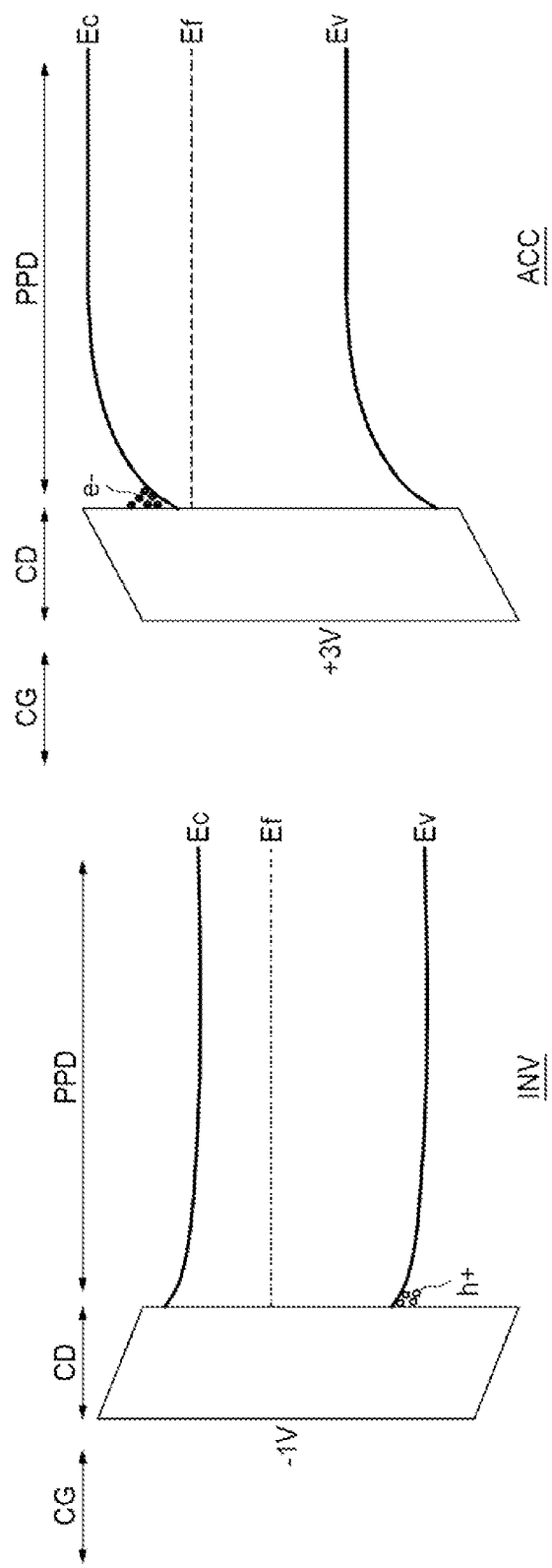
FIGS. 5A-5B show diagrams of energy bands in the photosensitive region.

FIG. 4 illustrates one example of a charge pumping signal SPC that is applied to the conducting electrode CG of the MOS capacitive element CM and notably designed to generate an alternation of successive inversion regimes INV (FIG. 5A) and accumulation regimes ACC (FIG. 5B) in the photosensitive region PPD.

FIGS. 5A-5B show diagrams of energy bands in the photosensitive region PPD, more particularly in the N− fully-depleted cathode region (FIG. 3), at the interface with the dielectric layer CD of the MOS capacitive element CM, in an inversion regime INV and in an accumulation regime ACC.

The position of the Fermi level Ef relative to the conduction band Ec and to the valence band Ev is shown arbitrarily for a semiconductor of the N type.

The example in FIG. 4 is presented in a context where the image sensor is adapted to a global shutter timed for example by the control circuit CMD (FIGS. 1A, 1B).

The control circuit CMD is thus configured for timing a shuttering cycle CO comprising a reset phase RES immediately followed by an integration phase INTG. The idea of the integration phase is a photogeneration of charges in the photosensitive region PPD, and the reset phase is intended to reset the charge of the photosensitive region PPD, notably by means of the charge pumping signal SPC.

During an integration phase INTG, the photosensitive region is exposed to light and charges are photogenerated, the photogenerated electrons e− accumulate in the N− cathode region.

During the integration INTG, the charge pumping signal SPC biases the electrode CG of the MOS capacitive element CM at a voltage of for example −1V, producing an inversion regime INV in the cathode region N−.

The inversion regime INV allows a potential barrier to be created around the MOS capacitive element CM so as to localize the photogenerated charges e− towards the interior of the photosensitive region PPD (the interior of the square PPD in FIG. 2, for example), and to avoid phenomena of unwanted transfers of charges between neighbouring regions PXv (FIG. 2).

Conversely, an absence of electrons in the valence band Ev or else positive charge carriers, called holes h+, accumulate at the interface with the dielectric layer CD. The holes h+ originate for example from the substrate Psub, via a channel covering the dielectric interface CD over its whole height.

Thus, holes h+ may be captured by the interface states QT, and potentially recombine with electrons e− which have already been trapped in the interface states QT.

After each integration phase INTG, the photogenerated charges are transferred to the read region by transfer devices such as previously described in relation with FIGS. 1A, 1B, 2 and 3.

Prior to each integration phase INTG, a reset phase RES is implemented in order to empty the photosensitive region PPD of possible unintentionally photogenerated charges, for example during the preceding read cycle.

During the reset phase RES, the charge pumping signal SPC is configured for generating an alternation of successive inversion regimes INV and accumulation regimes ACC in the photosensitive region PPD.

For this purpose, the charge pumping signal SPC is generated by the control circuit CMD in the form of square voltage pulses, in other words pulses of square shape, having very short rise and fall times. Potentially, the pulses may have a triangular signal shape. For example, the transition times are in the range between a nanosecond and a microsecond. The period of the pulses is, for example, in the range between 10 nanoseconds and 2 milliseconds.

Each voltage pulse of the charge pumping signal SPC biases the electrode CG of the MOS capacitive element CM at a voltage of for example +3V producing an accumulation regime ACC in the N− cathode region.

The accumulation regime ACC, for its part, allows the electrons e− photogenerated in the conduction band Ec to accumulate at the interface between the photosensitive region PPD and the dielectric layer CD.

The electrons e− thus accumulated may thus be captured by the interface states QT, and recombine with the holes h+ which have been trapped during the preceding inversion regime INV. After a recombination, the two charges disappear, and an electron e− may be captured in the trap QT.

The following inversion regime INV accumulates the holes h+ at the interface, the holes h+ are captured in the interface states QT and recombine there with the electrons e− which have been trapped there, then other holes h+ may be captured.

Then, so on and so forth, the photogenerated charges e− are recombined in the traps at the interface QT, twice per period of the charge pumping signal SPC, and disappear in this manner so as to reset the photosensitive region PPD.

In other words, the charge pumping signal SPC generates recombinations of the photogenerated charges e− with opposite charges h+ and trappings of the photogenerated charges e− from the photosensitive region PPD, in the charge traps QT at the interface, during the successive inversion regimes INV; and generates recombinations of the trapped photogenerated charges e− with opposite charges h+, and trappings of opposite charges h+, in the charge traps QT at the interface, during the successive accumulation regimes ACC.

Furthermore, optionally or alternatively, the same mechanism of recombination of the photogenerated charges in the photosensitive region may be used in an anti-blooming function AB.

Indeed, when the photogenerated charges arrive at saturation in the N− cathode region, the blooming effect may occur if other charges continue to be photogenerated and spontaneous transfers to neighboring regions may take place.

Thus, the shuttering cycle CO timed by the control circuit CMD (FIGS. 1A and 1B) may be configured for generating the charge pumping signal SPC designed to keep the charge of the photosensitive region PPD lower than a saturation threshold, by recombination of the charges e− photogenerated in saturation, during the integration phase INTG, for example at the end AB of the integration phase INTG.

For example, the charge pumping signal SPC designed to keep the charge of the photosensitive region PPD lower than a saturation threshold may have exactly the same characteristics as described hereinabove in relation with the reset phase RES, but potentially of lower amplitude. For example, the voltage level of the pulses producing the accumulation regimes ACC may be +1V, in order to limit the quantity of recombinations and avoid interfering with the integration phase INTG.

Figure 6:
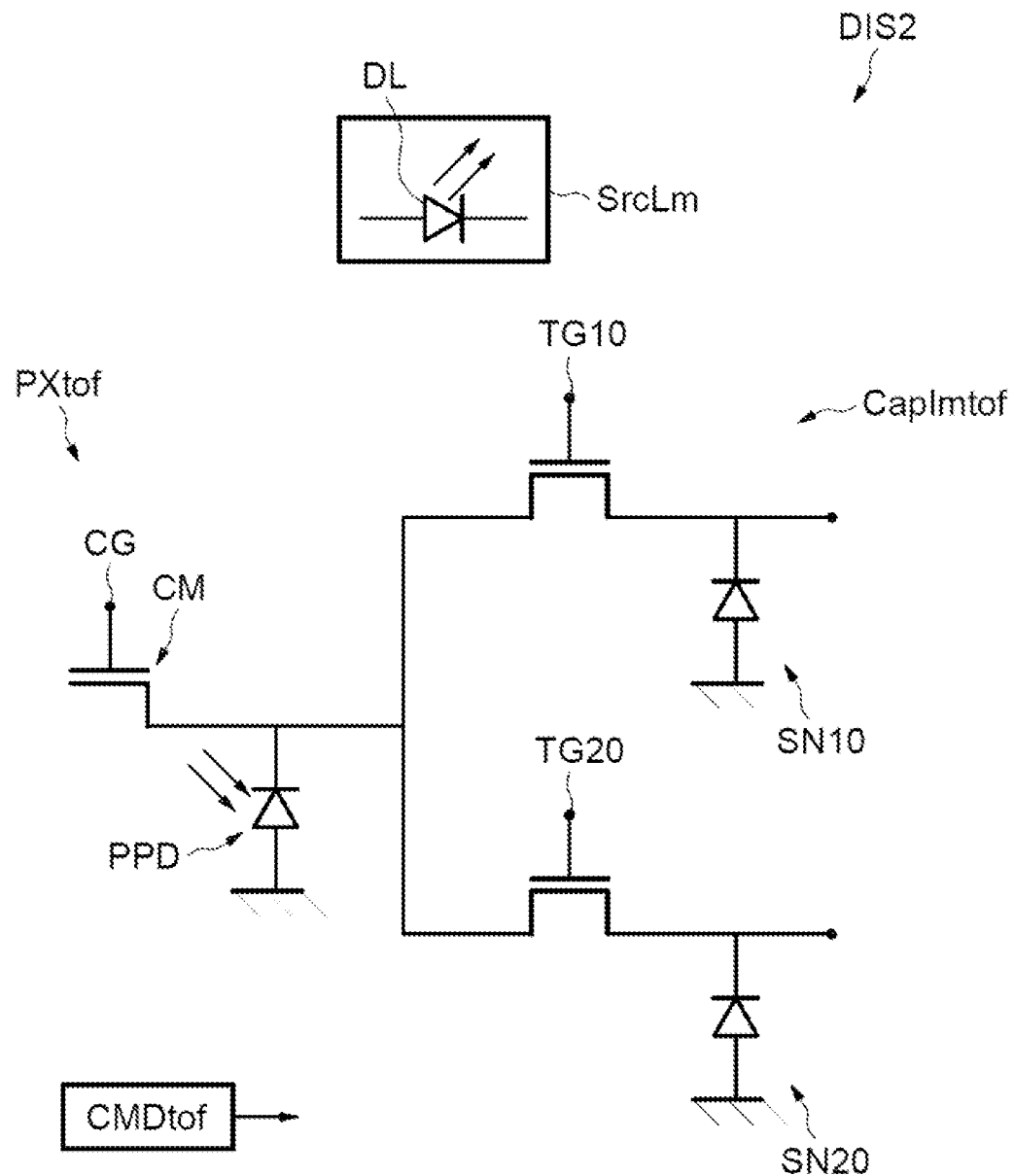
FIG. 6 illustrates another type of image sensor.

FIG. 6 illustrates another type of image sensor CapImtof, designed for a device for measuring distance by time of flight DIS2.

The device DIS2 comprises a light source SrcLm capable of emitting a light signal, for example by means of a diode laser DL. The image sensor CapImtof and the light source SrcLm are designed to collaborate in order to measure a distance by time of flight of the light signal.

Each pixel PXtof of the image sensor CapImtof comprises a photosensitive region PPD, a MOS capacitive element CM, and two different read regions SN10, SN20, coupled to the photosensitive region PPD by two parallel transfer transistors TG10, TG20. Each element of the pixel is similar to its analogue previously described in relation with FIGS. 1 to 5, and using the same references.

A control circuit CMDtof is nevertheless configured for controlling the elements of the image sensor CapImtof in the manner shown in FIG. 7.

FIG. 7 illustrates signals generated by the control circuit CMDtof for measuring a distance by time of flight.

The measurement of a distance by time of flight of a signal modulated in amplitude corresponds, for example, to a measurement of a time passed between the emission of a light signal and the reception of this signal after a reflection or a scattering on a remote element. Dividing this time by two and multiplying it by the speed of the light allows the distance separating the device DIS2 from the remote element to be evaluated.

The time between the emission of the emitted signal SEM and the reception of the received signal SRC may be calculated with the knowledge of a phase shift on the signal received SRC with respect to the phase of the emitted signal SEM, and of the frequency of the signal modulated in amplitude SEM.

In order to measure the phase shift, a sampling at two successive phase positions (N=2) on the received signal SRC is carried out at high frequency, for example between 10 MHz and 130 MHz, on the two different read regions SN10, SN20.

The parallel transfer transistors TG10, TG20 (FIG. 6) are controlled for this purpose by sampling signals in phase opposition (because N=2, see hereinafter), respectively referenced TG10, TG20 (FIG. 7).

Thus, the reading of each read region SN10, SN20 is representative of a level of amplitude of the received signal SRC at a respective position in the phase of the received signal SRC. These two parameters allow the phase of the received signal SRC to be determined.

Techniques using a number N, N≥2, of read regions SN10, SN20 and respectively N parallel transfer transistors TG10, TG20 may be implemented by adapting the sampling signals to the number N with respect to the frequency of the emitted signal SEM. For example, the sampling signals will be configured for successively controlling transfers of charges one by one into the N read regions during one period of the modulated signal SEM.

The control circuit CMDtof is therefore configured for controlling an emission, by the light source SrcLm, of the signal modulated in amplitude SEM, for example in infrared light, during an illumination phase ILM.

During the illumination phase ILM, the photosensitive regions PPD are controlled so as to be in the integration phase INTG. During the integration phase INTG, the transfer transistors TG10, TG20 are controlled by said sampling signals at the sampling frequency. The transition transistors TG10, TG20 thus controlled implement the mechanism described hereinabove for determining the phase of the integrated signal SRC by the photosensitive region PPD, and the phase shift may be measured.

After an illumination phase ILM, the light source SrcLm typically requires an idle phase REP, for example in order to cool down. During the idle phase REP, a phase for resetting the photosensitive region RES is implemented in exactly the same way as previously described in relation with FIGS. 1 to 5.

Thus, during the following integration phase INTG, the unwanted charges photogenerated during the idle phase REP do not interfere with the measurement, furthermore very precisely implemented.

Furthermore, the invention is not limited to these embodiments and their implementation but encompasses all their variants, for example, the anti-blooming function described in relation with FIG. 4 could be conditioned by a saturation or be systematic, be executed at the end of integration or, more reasonably, throughout the integration period.

The invention claimed is:

1. An image sensor, comprising:
   at least one pixel comprising a photosensitive region accommodated in a semiconductor substrate, and a metal-oxide-semiconductor (MOS) capacitive element comprising a conducting electrode electrically isolated by a dielectric layer having an interface with both the photosensitive region and the semiconductor substrate, wherein the interface of the dielectric layer comprises charge traps;
   wherein the capacitive element comprises a capacitive deep trench isolation structure having said conducting electrode extending vertically into the semiconductor substrate, and said dielectric layer surrounding the conducting electrode on sides and a bottom of the capacitive deep trench isolation structure; and
   a control circuit configured to bias the electrode of the MOS capacitive element with a charge pumping signal that generates an alternation of successive inversion regimes and accumulation regimes in the photosensitive region to produce recombinations of photogenerated charges in the charge traps of the interface of the dielectric layer and generate a substrate current to empty recombined photogenerated charges.

2. The image sensor according to claim 1, wherein the charge pumping signal comprises square voltage pulses.

3. The image sensor according to claim 1, wherein the successive inversion regimes in response to the charge pumping signal generate recombinations of the photogenerated charges with opposite charges and trappings of the photogenerated charges in the charge traps at the interface; and wherein the successive accumulation regimes generate recombinations of the trapped photogenerated charges with opposite charges and trappings of opposite charges in the charge traps at the interface.

4. The image sensor according to claim 1, wherein the capacitive deep trench isolation structure of the MOS capacitive element is configured to isolate the photosensitive regions of neighboring pixels from one another.

5. The image sensor according to claim 1, wherein the photosensitive region of the pixel is configured to receive a light signal incident on a back face of the semiconductor substrate.

6. The image sensor according to claim 1, wherein the control circuit is further configured to time a shuttering cycle of said at least one pixel comprising a reset phase immediately followed by an integration phase for a photogeneration of charges in the photosensitive region, the control circuit further generating the charge pumping signal during the reset phase to reset the charge of the photosensitive region of the pixel by recombination of the photogenerated charges contained in the photosensitive region.

7. The image sensor according to claim 1, wherein the control circuit is further configured to time a shuttering cycle of said at least one pixel comprising an integration phase for a photogeneration of charges in the photosensitive region, the control circuit further generating the charge pumping signal during the integration phase in order to keep the charge of the photosensitive region of the pixel lower than a saturation threshold by recombination of the charges photogenerated in saturation.

8. A device configured to measure distance by time of flight, comprising:
   a light source capable of emitting a light signal; and
   an image sensor comprising:
      at least one pixel comprising a photosensitive region accommodated in a semiconductor substrate, and a metal-oxide-semiconductor (MOS) capacitive element comprising a conducting electrode electrically isolated by a dielectric layer having an interface with both the photosensitive region and the semiconductor substrate, wherein the interface of the dielectric layer comprises charge traps; and a control circuit configured to bias the electrode of the MOS capacitive element with a charge pumping signal that generates an alternation of successive inversion regimes and accumulation regimes in the photosensitive region to produce recombinations of photogenerated charges in the charge traps of the interface of the dielectric layer and generate a substrate current to empty recombined photogenerated charges;

wherein the control circuit is further configured to time a shuttering cycle of said at least one pixel comprising a reset phase immediately followed by an integration phase for a photogeneration of charges in the photosensitive region, the control circuit further:

generating the charge pumping signal during the reset phase to reset the charge of the photosensitive region of the pixel by recombination of the photogenerated charges contained in the photosensitive region; and generating the charge pumping signal during the integration phase in order to keep the charge of the photosensitive region of the pixel lower than a saturation threshold by recombination of the charges photogenerated in saturation;

wherein the image sensor and the light source collaborate in order to measure a distance by time of flight of the light signal during said integration phase and to provide an idle time for the light source during the reset phase.

9. The device according to claim 8, wherein the charge pumping signal comprises square voltage pulses.

10. The device according to claim 8, wherein the successive inversion regimes in response to the charge pumping signal generate recombinations of the photogenerated charges with opposite charges and trappings of the photogenerated charges in the charge traps at the interface; and wherein the successive accumulation regimes generate recombinations of the trapped photogenerated charges with opposite charges and trappings of opposite charges in the charge traps at the interface.

11. The device according to claim 8, wherein the capacitive element comprises a capacitive deep trench isolation structure having said conducting electrode extending vertically into the semiconductor substrate, and said dielectric layer surrounding the conducting electrode on the sides and the bottom of the capacitive deep trench isolation structure.

12. The device according to claim 11, wherein the capacitive deep trench isolation structure of the MOS capacitive element is configured to isolate the photosensitive regions of neighboring pixels from one another.

13. The device according to claim 8, wherein the photosensitive region of the pixel is configured to receive a light signal incident on a back face of the semiconductor substrate, and wherein the MOS capacitive element has a planar structure having said conducting electrode extending over said dielectric layer, the dielectric layer lying horizontally on a front face of the semiconductor substrate opposite to the back face.

14. An imaging device, comprising:
an image sensor comprising:
a plurality of pixels, each pixel comprising a photosensitive region accommodated in a semiconductor substrate, and a metal-oxide-semiconductor (MOS) capacitive element comprising a conducting electrode electrically isolated by a dielectric layer having an interface with both the photosensitive region and the semiconductor substrate, wherein the interface of the dielectric layer comprises charge traps;

wherein the capacitive element comprises a capacitive deep trench isolation structure having said conducting electrode extending vertically into the semiconductor substrate, and said dielectric layer surrounding the conducting electrode on the sides and the bottom of the capacitive deep trench isolation structure; and a control circuit configured to bias the electrode of the MOS capacitive element with a charge pumping signal that generates an alternation of successive inversion regimes and accumulation regimes in the photosensitive region to produce recombinations of photogenerated charges in the charge traps of the interface of the dielectric layer and generate a substrate current to empty recombined photogenerated charges;

wherein the image sensor is configured for operation in a global shutter mode of operation comprising a simultaneous exposure of all the pixels, and a sequential read of the pixels in order to reproduce an image of a light signal incident on said pixels.

15. The device according to claim 14, wherein the charge pumping signal comprises square voltage pulses.

16. The device according to claim 14, wherein the successive inversion regimes in response to the charge pumping signal generate recombinations of the photogenerated charges with opposite charges and trappings of the photogenerated charges in the charge traps at the interface; and wherein the successive accumulation regimes generate recombinations of the trapped photogenerated charges with opposite charges and trappings of opposite charges in the charge traps at the interface.

17. The device according to claim 14, wherein the capacitive deep trench isolation structure of the MOS capacitive element is configured to isolate the photosensitive regions of neighboring pixels from one another.

18. The device according to claim 14, wherein the photosensitive region of the pixel is configured to receive a light signal incident on a back face of the semiconductor substrate.

19. A method for controlling an image sensor, comprising at least one pixel comprising a photosensitive region accommodated within a semiconductor substrate, and a metal-oxide-semiconductor (MOS) capacitive element comprising a conducting electrode electrically isolated by a dielectric layer having an interface with the photosensitive region and with the semiconductor substrate, the interface of the dielectric layer comprising charge traps, the method comprising:

implementing a shuttering cycle of said at least one pixel comprising an integration phase comprising a photogeneration of charges by the photosensitive region of the pixel;

biasing of the electrode of the MOS capacitive element with a charge pumping signal generating an alternation of successive inversion regimes and accumulation regimes in the photosensitive region to produce recombinations of photogenerated charges in the charge traps of the interface of the dielectric layer and generate a substrate current to empty recombined photogenerated charges; and using the charge pumping signal to keep the charge of the photosensitive region of the pixel lower than a saturation threshold during the integration phase by recombination of the photogenerated charges in saturation.

20. The method according to claim 19, wherein the charge pumping signal comprises square voltage pulses.

21. The method according to claim 19, wherein during the successive inversion regimes the charge pumping signal generates recombinations of the photogenerated charges with opposite charges and trappings of the photogenerated charges in the charge traps at the interface; and wherein during the successive accumulation regimes the charge pumping signal generates recombinations of the trapped photogenerated charges with opposite charges and trappings of opposite charges in the charge traps at the interface.

22. The method according to claim 19, further comprising:
   implementing a shuttering cycle of said at least one pixel comprising a reset phase immediately followed by an integration phase comprising a photogeneration of charges by the photosensitive region of the pixel; and
   using the charge pumping signal to reset the charge of the photosensitive region of the pixel during the reset phase by recombination of the photogenerated charges contained in the photosensitive region.

23. An image sensor, comprising:
   at least one pixel comprising a photosensitive region accommodated in a semiconductor substrate, and a metal-oxide-semiconductor (MOS) capacitive element comprising a conducting electrode electrically isolated by a dielectric layer having an interface with both the photosensitive region and the semiconductor substrate, wherein the interface of the dielectric layer comprises charge traps; and
   a control circuit configured to bias the electrode of the MOS capacitive element with a charge pumping signal that generates an alternation of successive inversion regimes and accumulation regimes in the photosensitive region to produce recombinations of photogenerated charges in the charge traps of the interface of the dielectric layer and generate a substrate current to empty recombined photogenerated charges;
   wherein the control circuit is further configured to time a shuttering cycle of said at least one pixel comprising an integration phase for a photogeneration of charges in the photosensitive region, the control circuit further generating the charge pumping signal during the integration phase in order to keep the charge of the photosensitive region of the pixel lower than a saturation threshold by recombination of the charges photogenerated in saturation.

24. The image sensor according to claim 23, wherein the charge pumping signal comprises square voltage pulses.

25. The image sensor according to claim 23, wherein the successive inversion regimes in response to the charge pumping signal generate recombinations of the photogenerated charges with opposite charges and trappings of the photogenerated charges in the charge traps at the interface; and wherein the successive accumulation regimes generate recombinations of the trapped photogenerated charges with opposite charges and trappings of opposite charges in the charge traps at the interface.

26. The image sensor according to claim 23, wherein the photosensitive region of the pixel is configured to receive a light signal incident on a back face of the semiconductor substrate, and wherein the MOS capacitive element has a planar structure having said conducting electrode extending over said dielectric layer, the dielectric layer lying horizontally on a front face of the semiconductor substrate opposite to the back face.

* * * * *